United States Patent
Arnold

(10) Patent No.: US 7,786,425 B2
(45) Date of Patent: Aug. 31, 2010

(54) OPTICAL SENSOR

(75) Inventor: Georg Arnold, Schwabach (DE)

(73) Assignee: DIEHL AKO Stiftung & Co. KG, Wangen (DE)

( * ) Notice: Subject to any disclaimer, the term of this patent is extended or adjusted under 35 U.S.C. 154(b) by 0 days.

(21) Appl. No.: 11/957,614

(22) Filed: Dec. 17, 2007

(65) Prior Publication Data

US 2008/0210851 A1   Sep. 4, 2008

(30) Foreign Application Priority Data

Dec. 15, 2006  (DE) .................. 10 2006 059 850

(51) Int. Cl.
*H01J 40/14* (2006.01)

(52) U.S. Cl. .............. 250/221; 250/227.22; 341/31; 345/175; 345/176; 385/12

(58) Field of Classification Search ........... 250/221, 250/216, 227.11, 227.22; 341/31; 345/173, 345/175, 176; 385/9, 12
See application file for complete search history.

(56) References Cited

U.S. PATENT DOCUMENTS

| 3,340,401 | A | | 9/1967 | Young |
| 4,688,892 | A | * | 8/1987 | Laakmann .................. 385/125 |
| 6,091,497 | A | * | 7/2000 | Paritsky et al. .............. 356/623 |
| 2005/0244126 | A1 | * | 11/2005 | Howard et al. .............. 385/133 |
| 2005/0252754 | A1 | | 11/2005 | Arnold |
| 2006/0282070 | A1 | | 12/2006 | Arnold |

FOREIGN PATENT DOCUMENTS

| DE | 1566695 | 6/1970 |
| DE | 4007971 A1 | 9/1991 |
| DE | 4408058 A1 | 9/1995 |
| DE | 19700836 C1 | 5/1998 |
| DE | 19917110 A1 | 10/2000 |
| DE | 102004053496 A1 | 5/2006 |

(Continued)

*Primary Examiner*—Kevin Pyo
(74) *Attorney, Agent, or Firm*—Laurence A. Greenberg; Werner H. Stemer; Ralph E. Locher

(57) ABSTRACT

An optical sensor for a touch-sensitive push button of a control mechanism for an electronic household appliance has a transmitter, which emits electromagnetic radiation, and a receiver, which receives reflected electromagnetic radiation. A cover is at least partly transparent to the electromagnetic radiation and the transmitter and the receiver are arranged behind the cover. A radiation guide mechanism, for example a diaphragm frame, is provided between the transmitter and the receiver, on the one hand, and the cover, on the other hand, for guiding the radiation emitted from the transmitter towards the cover and to guide the reflected radiation penetrating the cover to the receiver. The diaphragm frame broadens the emission characteristic of the transmitter outward from the cover and/or the reception characteristic of the receiver inward into the cover. Additionally or alternatively, the emission characteristic outward from the cover is inclined in the direction of the reception characteristic of the receiver into the cover and/or the reception characteristic of the receiver into the cover is inclined in the direction of the emission characteristic of the transmitter out from the cover. This moves the range of intersection between emission and reception characteristic closer to the cover, so that the signal-to-noise ratio of the optical sensor is reduced.

12 Claims, 3 Drawing Sheets

FOREIGN PATENT DOCUMENTS

| | | | |
|---|---|---|---|
| DE | 102004025878 B4 | 6/2006 |
| DE | 102004062384 A1 | 7/2006 |
| DE | 10 2005 025 782 A1 | 12/2006 |
| EP | 0041830 A1 | 12/1981 |
| EP | 1653621 A2 | 5/2006 |
| WO | 2006069902 A1 | 7/2006 |

* cited by examiner

OPTICAL SENSOR

CROSS-REFERENCE TO RELATED APPLICATION

This application claims the priority, under 35 U.S.C. §119, of German patent application DE 10 2006 059 850.4, filed Dec. 15, 2006; the prior application is herewith incorporated by reference in its entirety.

BACKGROUND OF THE INVENTION

Field of the Invention

The present invention concerns an optical sensor, and especially an optical sensor for a touch-sensitive push button, suitable for use in a control mechanism of an electronic household appliance. Optical sensor has a transmitter, which emits electro-magnetic radiation, a receiver receiving the electromagnetic radiation, and a cover at least partly transparent to the electromagnetic radiation, behind which are arranged the transmitter and the receiver. The device further has a radiation guide mechanism, which is provided between the transmitter and the receiver, on the one hand, and the cover, on the other hand, in order to guide the radiation emitted from the transmitter to the cover and to guide the reflected radiation penetrating the cover to the receiver.

The fundamental construction and basic principle of an optical sensor for a touch-sensitive push button are known, for example, from German published patent application DE 40 07 971 A1 (cf. EP 0446642 A1). There, the optical sensor has a transmitter, which emits an electromagnetic radiation, and a receiver, receiving an electromagnetic radiation, which are arranged behind a cover at least partly transparent to the electromagnetic radiation. Moreover, there is generally provided a radiation guide mechanism between the transmitter and the receiver, on the one hand, and the cover, on the other, in order to guide the radiation emitted from the transmitter to the cover and to guide the reflected radiation penetrating the cover to the receiver.

In the most simple case, this radiation guide mechanism consists, for example, of a diaphragm frame, which surrounds the transmitter and the receiver. To achieve a better signal/noise ratio, moreover, it is known how to use a light guide as the radiation guide mechanism, such as is disclosed in German patent DE 197 00 836 C1 and in German patent DE 10 2004 025 878 B4 (corresp. to US 2005/0252754 A1), for example.

One advantageous application of such optical sensors is their use in touch-sensitive push buttons for control mechanisms of electronic household appliances, such as ranges, glass ceramic range tops, microwave ovens and the like, in which the push button is accommodated behind a cover, such as a glass sheet or glass ceramic sheet, for easy operation and cleaning.

SUMMARY OF THE INVENTION

It is accordingly an object of the invention to provide an optical sensor, which overcomes the above-mentioned disadvantages of the heretofore-known devices and methods of this general type and which further develops the optical sensor so that it has a reduced signal/noise ratio.

With the foregoing and other objects in view there is provided, in accordance with the invention, an optical sensor, comprising:

a transmitter for emitting electromagnetic radiation;

a receiver for receiving electromagnetic radiation;

a cover formed to be at least partly transparent to the electromagnetic radiation, the transmitter and the receiver being disposed behind the cover; and a radiation guide mechanism disposed between the cover and the transmitter and between the cover and the receiver, the radiation guide mechanism guiding the electromagnetic radiation emitted from the transmitter towards the cover and guiding the electromagnetic radiation, after reflection outside the cover, to the receiver, the radiation guide mechanism being configured to broaden an emission characteristic of the transmitter outwardly from the cover and/or broadening a reception characteristic of the receiver inwardly into the cover.

In an alternative implementation of the inventive concept, the radiation guide mechanism is configured such that an emission characteristic of the transmitter outwardly from the cover is inclined in a direction towards a reception characteristic of the receiver into the cover and/or the reception characteristic of the receiver into the cover is inclined in a direction towards the emission characteristic of the transmitter outwardly from the cover.

It should be noted, in this context, that the terms "emission characteristic" and "reception characteristic" are referenced to the respective component. It is conventional to refer to the emission characteristic of a transmitter "as seen" by the transmitter, and to refer to the reception characteristic of a receiver "as seen" by the receiver. That is, a reception characteristic that broadens refers to a beam or radiation cone that broadens away from the receiver.

In other words, the invention concerns an optical sensor, with a transmitter, which emits an electromagnetic radiation; a receiver, receiving electromagnetic radiation; a cover at least partly transparent to the electromagnetic radiation, behind which are arranged the transmitter and the receiver; and a radiation guide mechanism, which is provided between the transmitter and the receiver, on the one hand, and the cover, on the other, in order to guide the radiation emitted from the transmitter to the cover and to guide the reflected radiation penetrating the cover to the receiver.

According to the first aspect of the invention, the optical sensor is characterized in that the radiation guide mechanism is configured such that the emission characteristic of the transmitter broadens outward from the cover and/or the reception characteristic of the receiver broadens inward into the cover.

The broadening of the emission and/or reception characteristic has the effect that the range of intersection between emission and reception characteristic is moved closer to the cover. As a result, when a finger is placed on the optical sensor the reception signal will be greater and the curve of reception signal strength vs. distance will decrease more rapidly with increasing distance from the cover, so that one can minimize mistakes due to fingers moving past the optical sensor at a distance or by other reflecting objects. In other words, the signal/noise ratio of the optical sensor is considerably reduced.

According to the second aspect of the invention, the optical sensor is characterized in that the radiation guide mechanism is configured so that the emission characteristic of the transmitter outward from the cover is inclined in the direction of the reception characteristic of the receiver into the cover and/or the reception characteristic of the receiver into the cover is inclined in the direction of the emission characteristic of the transmitter out from the cover.

The inclination of the emission and/or reception characteristic in the direction of the other particular characteristic likewise has the effect that the region of intersection between emission and reception characteristic is moved closer to the cover. As a result, in this design as well, the signal/noise ratio of the optical sensor is substantially reduced, similar to the above first aspect.

The features of the first and second aspect of the invention can preferably be combined with each other, so that the above described effect can be further strengthened.

If the radiation guide mechanism is a diaphragm frame, which surrounds the transmitter and the receiver and has an exit opening coordinated with the transmitter arranged on its side facing the cover and an entry opening coordinated with the receiver, in order to achieve the above first aspect the inner surfaces of the diaphragm frame are fashioned to be at least partly reflecting the electromagnetic radiation; and to achieve the above second aspect, the diaphragm frame can be fashioned to taper inwardly in the direction of the cover.

If the radiation guide mechanism has a first light guide, coordinated with the transmitter, and a second light guide, coordinated with the receiver, in order to achieve the above first aspect the end face of the first and/or the second light guide turned toward the cover can be diffuse scattering; and to achieve the above second aspect, the first and/or second light guide can be arranged inclined inwardly in the direction of the cover and/or be fashioned to slope inwardly in the region turned toward the cover.

Alternatively, to achieve the above first aspect, the radiation guide mechanism can have a first waveguide coordinated with the transmitter and a second waveguide coordinated with the receiver. In this case, to achieve the above second aspect, the first and/or second waveguide can be arranged inclined inwardly in the direction of the cover and/or be fashioned to slope inwardly in the region turned toward the cover.

Other features which are considered as characteristic for the invention are set forth in the appended claims.

Although the invention is illustrated and described herein as embodied in optical sensor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

With reference to the enclosed drawings, various preferred exemplary embodiments of the invention shall now be explained more closely by means of an optical sensor that can be used for a touch-sensitive push button of a control mechanism of an electronic household appliance. But the present invention, of course, is not limited merely to this special application of the optical sensor.

Furthermore, in the exemplary embodiments described hereafter, infrared radiation shall be used preferably as the electromagnetic radiation. It will be understood that this is for ease of explanation only and should not limit the present invention to such radiation.

Figure 1:
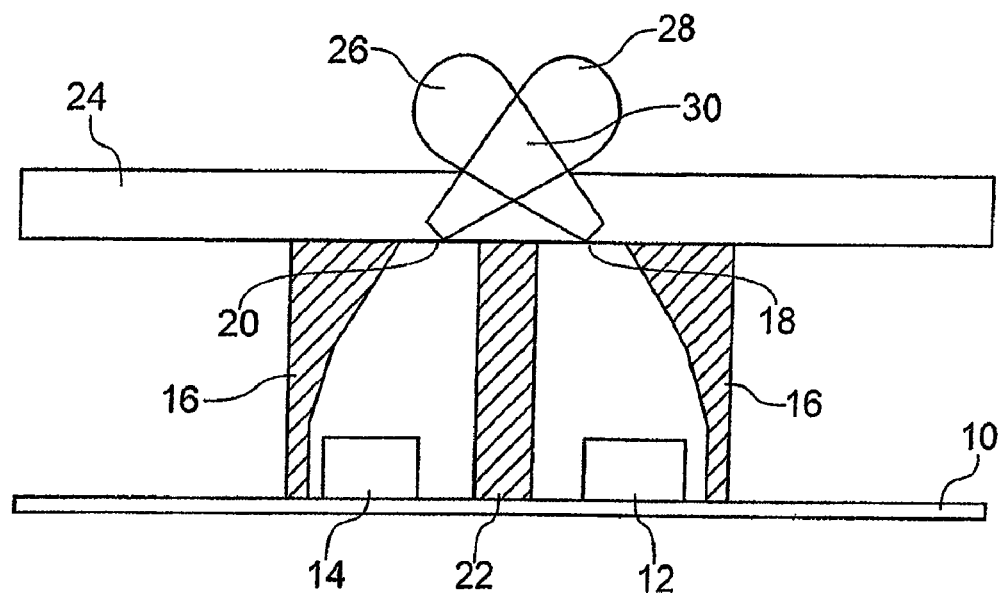
FIG. 1 is a schematic sectional view of the construction and mode of operation of an optical sensor according to a first preferred exemplary embodiment with a diaphragm frame as the radiation guide mechanism.
Figure 2:
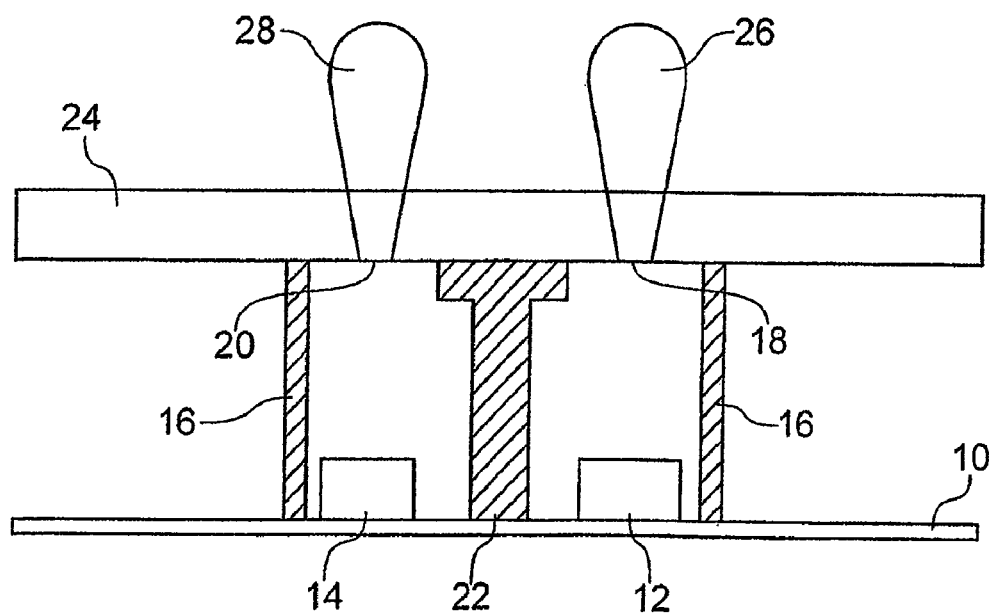
FIG. 2 is a schematic sectional view showing a prior art optical sensor with a diaphragm frame, for comparison.
Figure 3:
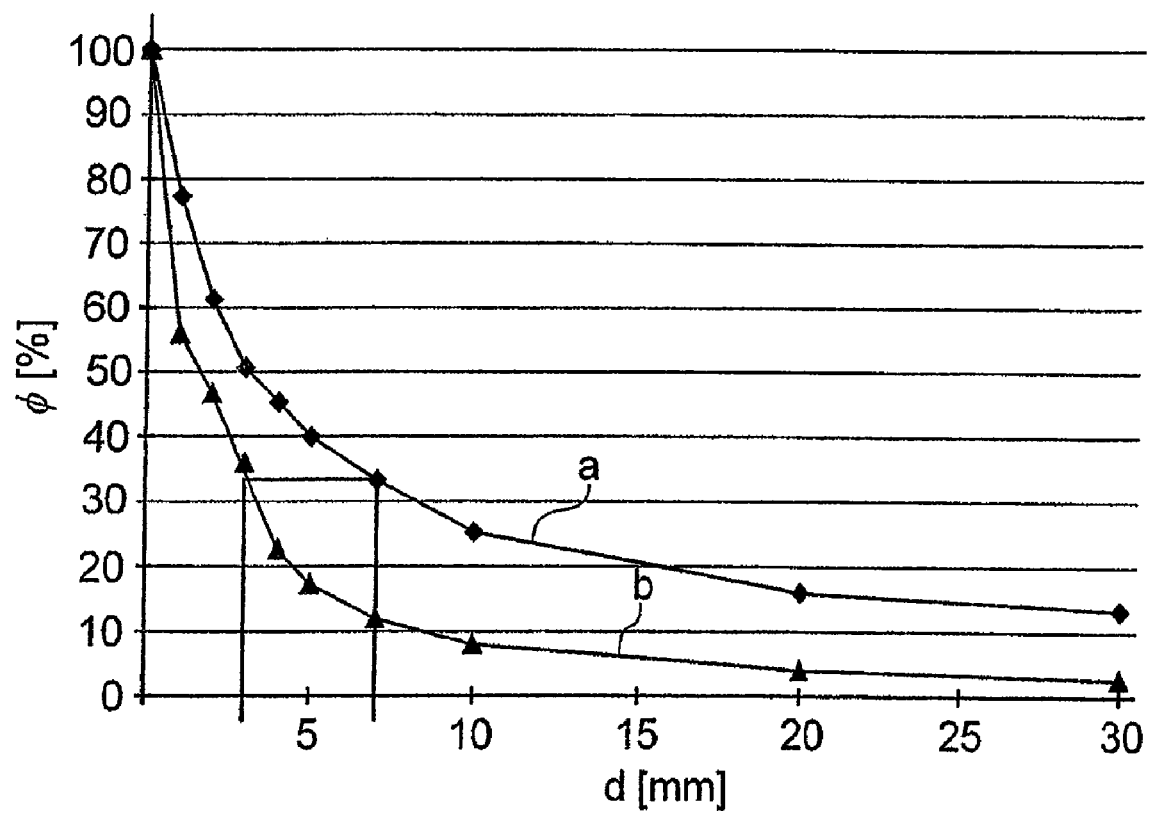
FIG. 3 is a plot diagram for comparison of the signal/noise ratio between the two optical sensors shown in FIGS. 1 and 2.

At first, we shall explain more closely the construction and mode of operation of an optical sensor according to a first exemplary embodiment, making reference to FIGS. 1 to 3.

The optical sensor of the touch-sensitive push button has, on a circuit board 10, an infrared transmitter 12 and an infrared receiver 14. The transmitter 12 and the receiver 14 are surrounded by a diaphragm frame 16, which has at its top side an exit opening 18 coordinated with the transmitter 12 and an entry opening 20 coordinated with the receiver. The diaphragm frame 16, made from a material as IR-impenetrable as possible, is inserted for example by feet through holes in the circuit board 10 and thus secured to it.

The transmitter 12 and the receiver 14 are arranged inside respective cavities beneath the frame openings 18, 20, which are preferably separated from each other by a substantially IR-impenetrable partition wall 22. Directly on the top side of the diaphragm frame 16 lies a cover 24 made from a material that is at least partly transparent to the electromagnetic radiation (here, IR), such as a glass ceramic sheet of a household range.

In the conventional, prior art case, as illustrated by FIG. 2, the radiation emitted by the transmitter 12 is taken by the diaphragm frame 16 out from the cover 24 through the exit opening 18, and this emission characteristic 26 of the transmitter 12, or rather the emission characteristic 26 of the transmitter 12 out from the cover 24 (i.e., the emitted radiation beam cone 26), basically has the shape of a relatively straight club.

When the touch-sensitive push button is activated by a finger placed on the surface of the cover 24, the radiation of the transmitter 12 is diffusely and multiply scattered, so that enough scattered light is reflected onto the receiver 14 and this can send a corresponding measurement signal to an evaluation circuit, in order to trigger a corresponding switching function. The reception characteristic 28 of the receiver 14, or rather the reception characteristic 28 of the receiver 14 into the cover 24 (i.e., the reflected radiation beam cone 28), similar to the emission characteristic 26 of the transmitter 12, is configured in the shape of a basically straight club, basically parallel to the emission characteristic 26.

As a comparison of FIG. 2 (prior art optical sensor) with FIG. 1 shows, the diaphragm frame 16 of the optical sensor according to the invention is fashioned so that, on the one hand, the emission characteristic 26 of the transmitter 12 and the reception characteristic 28 of the receiver 14 are broadened in spherical shape and, on the other hand, the emission characteristic 26 and the reception characteristic 28 are inclined toward each other. As is clearly recognizable in FIG. 1, this has the effect that the region of intersection 30 between emission and reception characteristic 26, 28, constituting the overall sensitive region of the sensor, is moved closer to the cover 24, which results in a distinctly reduced signal/noise ratio of the optical sensor with such a design, as explained hereafter.

The broadening of emission and reception characteristics 26, 28 is achieved, for example, in that the inner surfaces of the diaphragm frame 16 are fashioned at least partly IR-reflecting (reflection preferably greater than 45% in the relevant reflection region). Furthermore, the diaphragm frame 16 should also be as IR-impenetrable as possible, and a transmission of less than 5% in the relevant reflection region is preferred. These properties of the diaphragm frame 16 can be achieved, for example, by appropriate coatings and/or choice of material of the diaphragm frame 16.

The inclination of emission and reception characteristics 26, 28 toward each other is achieved, for example, by an appropriate configuration of the diaphragm frame 16, in particular, a tapering of the diaphragm frame inward in the direction of the cover. With a suitable design of the diaphragm frame 16, the relevant intersection region 30 of the characteristics 26, 28 can be moved into the surface region of the cover 24. Thus, an object outside this overall sensitive region 30 can hardly cause a reflection of radiation into the receiver 14.

The two mentioned steps can be employed both simultaneously and also alternatively. Moreover, it is also possible in the context of the invention to influence either only the emission characteristic 26 or only the reception characteristic 28 as described above, even though this limits the advantageous effect.

The action of the invented configuration of the optical sensor is further illustrated in FIG. 3.

FIG. 3 shows a characteristic diagram with a curve "a" for the traditional optical sensor of FIG. 2 and a curve "b" for an optical sensor of the invention per FIG. 1, in which only the widening, but not the tilting of the two characteristics 26, 28 is realized. The abscissa shows the distance d (in mm) between the cover 24 and a finger; along the ordinate is plotted the reception signal level φ (in %), setting the value for a finger placed on the push button (d=0) at 100%.

If, for example, a traditional optical sensor (curve a) responds at a finger distance of d=7 mm, then an optical sensor of the invention (curve b) responds at a distance of d=3 mm, and the signal/noise ratio remains unchanged. Due to the steeper curve b of signal level vs. distance, the interference distance of the optical sensor is distinctly reduced. The problem of traditional optical sensors, that they respond already at rather large finger distance or even that they respond very poorly, can be avoided in this way. Another benefit is that the reception signal level is also increased when a finger is placed on the optical sensor.

As explained above, the reducing of the interference distance of the optical sensor can be achieved by simple means (a slightly modified diaphragm frame 16), so that the installation expense and the production costs can be kept low.

Figure 4:
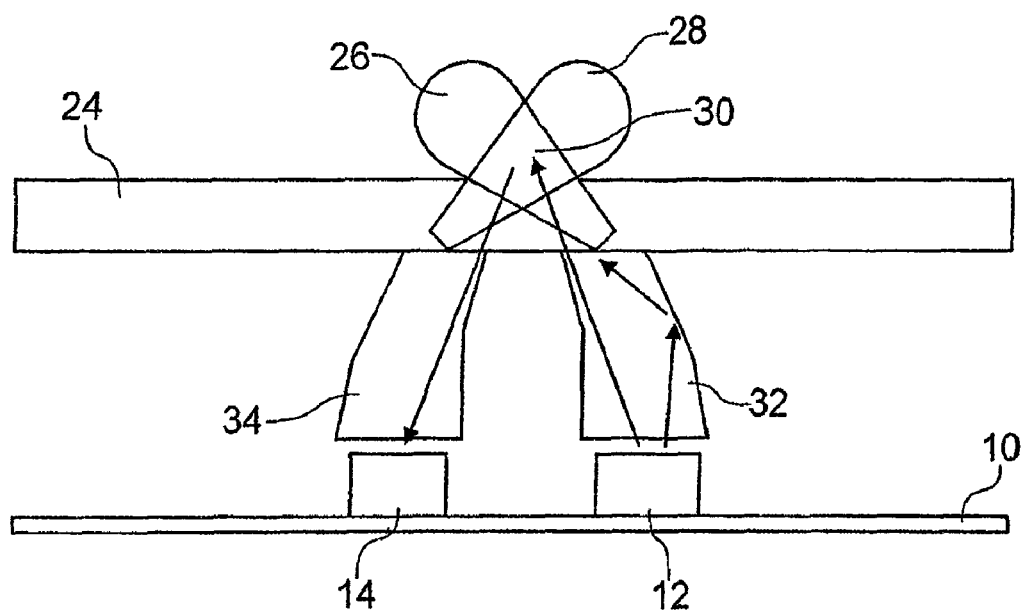
FIG. 4 is a schematic sectional view of the construction and mode of operation of an optical sensor according to a second preferred exemplary embodiment with waveguides as the radiation guide mechanism.

FIG. 4 shows schematically the makeup of an optical sensor according to a second exemplary embodiment of the invention. The same or corresponding components are given the same reference numbers as in the above first exemplary embodiment, and we shall refrain from a repetitive description.

The second exemplary embodiment of FIG. 4 differs from the embodiment shown in FIG. 1 by the configuration of the radiation guide mechanism. The radiation guide mechanism in this case has a first waveguide 32, which is coordinated with the transmitter 12, and a second waveguide 34, which is coordinated with the receiver 14. The two waveguides 32, 34 replace the diaphragm frame 16 and are of course made reflecting on their inner surfaces, i.e., they are appropriately coated or made altogether from an appropriate material. In the region toward the cover 24, the two waveguides 32, 34 are each fashioned with an inward sloping, i.e., in the direction of the other respective waveguide.

This design of the optical sensor with the two waveguides 32, 34 produces the same advantages as in the above described first exemplary embodiment.

Figure 5:
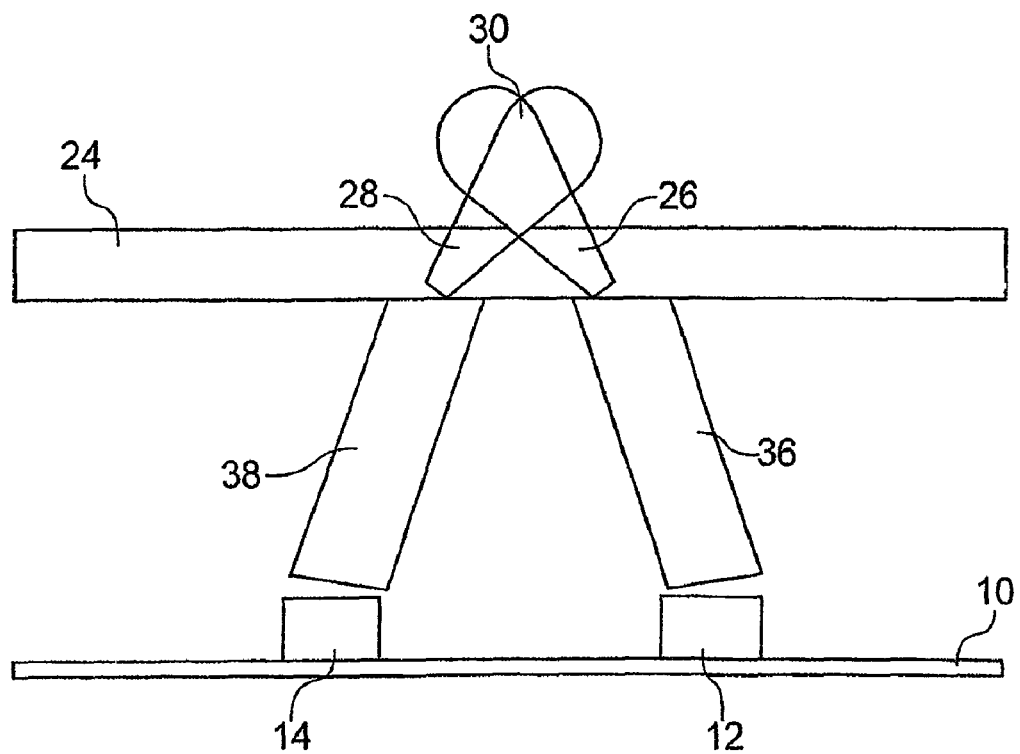
FIG. 5 is a schematic sectional view of the construction and mode of operation of an optical sensor according to a third preferred exemplary embodiment with light-guides forming the radiation guide mechanism.

FIG. 5 shows schematically the makeup of an optical sensor according to a third exemplary embodiment of the invention. The same or corresponding components are given the same reference numbers as in the above first exemplary embodiment, so that a repeated description shall not be given.

In particular, at rather large distances between transmitter 12/receiver 14 and cover 24, it can be advantageous for a better evaluation of the signals to use light guides as the radiation guide mechanism, instead of the simple diaphragm frame 16. Thus, the optical sensor of FIG. 5 contains a first light guide 36, which is coordinated with the transmitter 12, and a second light guide 38, which is coordinated with the receiver 14.

For the broadening of the emission characteristic 26 of the transmitter 12 and the reception characteristic 28 of the receiver 14, the end faces of the respective light guides 36, 38 toward the cover 24 are made diffusely scattering (e.g., by roughening or dulling).

Furthermore, the two light guides 36, 38 are arranged overall inclined toward each other, as shown in FIG. 5. Alternatively, the light guides 36, 38 can also be formed inclined accordingly only in the region toward the cover 24 or be fashioned with appropriately beveled exit or entry surfaces. Thanks to the slanted positioning of the light guides 36, 38, the corresponding characteristics are also inclined toward each other.

Thus, overall, in the third exemplary embodiment as well, the same benefits can be achieved as are described at length above in connection with the first exemplary embodiment.

The invention claimed is:

1. An optical sensor, comprising:
a transmitter for emitting electromagnetic radiation;
a receiver for receiving electromagnetic radiation;
a cover formed to be at least partly transparent to the electromagnetic radiation, said transmitter and said receiver being disposed behind said cover; and
a radiation guide mechanism disposed between said cover and said transmitter and between said cover and said receiver, said radiation guide mechanism guiding the electromagnetic radiation emitted from said transmitter towards said cover and guiding the electromagnetic radiation, after reflection outside said cover, to said receiver, said radiation guide being configured to broaden an emission characteristic of said transmitter outwardly from said cover and/or broadening a reception characteristic of said receiver inwardly into said cover; and
said radiation guide mechanism including a first solid structure light guide aligned with said transmitter, and a second solid structure light guide aligned with said receiver; and
at least one of said first and second solid structure light guides having a diffusing, scattering end face turned towards said cover.

2. The optical sensor according to claim 1, wherein said radiation guide mechanism is configured so that the emission characteristic of said transmitter outward from said cover is inclined in a direction towards the reception characteristic of the receiver into said cover and/or the reception characteristic of said receiver into said cover is inclined in a direction towards the emission characteristic of said transmitter out of said cover.

3. The optical sensor according to claim 1, wherein:
said radiation guide mechanism is a diaphragm frame surrounding said transmitter and said receiver and having an exit opening coordinated with said transmitter, on a side thereof facing said cover, and an entry opening coordinated with said receiver.

4. The optical sensor according to claim 1, wherein:
said radiation guide mechanism is a diaphragm frame surrounding said transmitter and said receiver and having an exit opening coordinated with said transmitter on a side facing said cover and an entry opening coordinated with said receiver; and
said diaphragm frame tapers inwardly in a direction toward said cover.

5. The optical sensor according to claim 1, wherein:
said radiation guide mechanism has a first light guide, coordinated with said transmitter, and a second light guide, coordinated with said receiver; and
at least one of said first and second light guides is inclined inwardly in a direction towards said cover and/or sloping inwardly in a region turned toward said cover.

6. The optical sensor according to claim 1, wherein:
said radiation guide mechanism has a first waveguide coordinated with said transmitter and a second waveguide coordinated with said receiver; and
at least one of said first and second waveguides is inclined inwardly in a direction towards said cover and/or sloping inwardly in a region turned toward the cover.

7. An optical sensor, comprising:
a transmitter for emitting electromagnetic radiation;
a receiver for receiving electromagnetic radiation;
a cover formed to be at least partly transparent to the electromagnetic radiation, said transmitter and said receiver being disposed behind said cover; and
a radiation guide mechanism disposed between said cover and said transmitter and between said cover and said receiver, said radiation guide mechanism guiding the electromagnetic radiation emitted from said transmitter towards said cover and guiding the electromagnetic radiation, after reflection outside said cover, to said receiver, said radiation guide mechanism including a first solid structure light guide disposed to transmit the electromagnetic radiation from said transmitter to and through said cover and a second solid structure light guide disposed to transmit electromagnetic radiation from said cover to said receiver and said solid structure light guides being configured such that an emission characteristic of said transmitter outwardly from said cover is inclined in a direction towards a reception characteristic of said receiver into said cover and/or the reception characteristic of the receiver into said cover is inclined in a direction towards the emission characteristic of said transmitter outwardly from said cover, and said first and second solid structure light guides having diffusing, scattering end faces turned towards said cover.

8. The optical sensor according to claim 7, wherein said radiation guide mechanism is configured such that the emission characteristic of said transmitter broadens outwardly from said cover and/or the reception characteristic of said receiver broadens inwardly into said cover.

9. The optical sensor according to claim 7, wherein:
at least one of said first and second light guides is inclined inwardly in a direction towards said cover and/or sloping inwardly in a region turned toward said cover.

10. The optical sensor according to claim 1, wherein said radiation guide mechanism is configured such that an emission characteristic of said transmitter outwardly from said cover is inclined in a direction towards a reception characteristic of said receiver into said cover and the reception characteristic of the receiver into said cover is inclined in a direction towards the emission characteristic of said transmitter outwardly from said cover.

11. The optical sensor according to claim 7, wherein said light guides of said radiation guide mechanism are inclined towards one another such that an emission characteristic of said transmitter outwardly from said cover is inclined in a direction towards a reception characteristic of said receiver into said cover and the reception characteristic of the receiver into said cover is inclined in a direction towards the emission characteristic of said transmitter outwardly from said cover.

12. The optical sensor according to claim 7, wherein said walls of said radiation guide mechanism are non-parallel walls.

* * * * *